US011782106B2

(12) United States Patent
Tamaru

(10) Patent No.: US 11,782,106 B2
(45) Date of Patent: Oct. 10, 2023

(54) PERMEABILITY MEASUREMENT JIG, PERMEABILITY MEASUREMENT DEVICE, AND PERMEABILITY MEASUREMENT METHOD

(71) Applicant: NATIONAL INSTITUTE OF ADVANCED INDUSTRIAL SCIENCE AND TECHNOLOGY, Tokyo (JP)

(72) Inventor: Shingo Tamaru, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 190 days.

(21) Appl. No.: 17/442,612

(22) PCT Filed: Sep. 2, 2019

(86) PCT No.: PCT/JP2019/034371
§ 371 (c)(1),
(2) Date: Sep. 24, 2021

(87) PCT Pub. No.: WO2020/194786
PCT Pub. Date: Oct. 1, 2020

(65) Prior Publication Data
US 2022/0171002 A1 Jun. 2, 2022

(30) Foreign Application Priority Data

Mar. 27, 2019 (JP) .................. 2019-060076

(51) Int. Cl.
G01R 33/12 (2006.01)
G01R 33/00 (2006.01)
F21V 8/00 (2006.01)

(52) U.S. Cl.
CPC ..... *G01R 33/1223* (2013.01); *G01R 33/0047* (2013.01); *G02B 6/0011* (2013.01)

(58) Field of Classification Search
CPC .................. G01R 33/00; G01R 33/1223; G01R 33/0035; G01R 33/0023; G01R 33/0017;
(Continued)

(56) References Cited

U.S. PATENT DOCUMENTS 9,568,568 B2 * 2/2017 Ebnabbasi ......... G01R 33/1223
2004/0021463 A1 * 2/2004 Miyazawa ............... H01Q 7/00
324/539
2018/0267128 A1 * 9/2018 Guisan ........... G01R 31/318511

FOREIGN PATENT DOCUMENTS

JP 2004-069337 A 3/2004
JP 2008-014920 A 1/2008

OTHER PUBLICATIONS

International Search Report from International Application No. PCT/JP2019/034371, dated Oct. 1, 2019.
(Continued)

*Primary Examiner* — Jermele M Hollington
*Assistant Examiner* — Taqi R Nasir
(74) *Attorney, Agent, or Firm* — Shih IP Law Group, PLLC

(57) ABSTRACT

In the present disclosure, there is provided a permeability measurement jig including a first waveguide, wherein a signal line of the first waveguide comprises an excited magnetic part at one end side, and a magnetic field is generated at the excited magnetic part by an excitation signal, and a second waveguide, wherein a signal line of the second waveguide comprises a detection part at one end side, a detection signal is induced at the detection part due to an action of the magnetic field generated at the excited magnetic part to a measurement sample, and the detection part is placed on the excited magnetic part to face the excited
(Continued)

magnetic part at a predetermined distance. A permeability measurement device having the permeability measurement jig and a permeability measurement method are disclosed.

15 Claims, 14 Drawing Sheets

(58) Field of Classification Search
CPC .............. G01R 31/3191; G01R 33/0047; G01B 7/004; G01C 17/38; G06F 3/017; G06F 3/0346; G06F 3/012; G02B 6/0011
See application file for complete search history.

(56) References Cited

OTHER PUBLICATIONS

Y. Chen et al., "Novel Ultra-Wide Band (10MHz-26 GHz) Permeability Measurements for Magnetic Films", IEEE Trans. Magn., 2018, vol. 54, No. 11, 6100504.

* cited by examiner

PERMEABILITY MEASUREMENT JIG, PERMEABILITY MEASUREMENT DEVICE, AND PERMEABILITY MEASUREMENT METHOD

TECHNICAL FIELD

The present invention relates to a measurement technique for a permeability of a magnetic substance and particularly relates to a jig for high frequency permeability measurement of a magnetic fine particle of a single substance and a permeability measurement device.

BACKGROUND ART

In recent years, electronic devices such as mobile phones and notebook personal computers are highly integrated due to solicitation of miniaturization, weight reduction or others, and there is a high likelihood that malfunction of the electronic devices may occur due to the effect of an electromagnetic noise generated by an incorporated integrated circuit chip. A noise suppression sheet for absorption and suppression of the electromagnetic noise, or an inductor or a choke coil for removal of noises of a power supply line and a signal line is used, and it is required to suppress the noises in a wide frequency range from a low frequency to a high frequency.

Many of the noise suppression sheets are hardened by mixing a binder with magnetic fine particles. For magnetic cores of the inductor and the choke coil, a powder magnetic core obtained by sintering magnetic fine particles or mixing and hardening the binder to suppress generation of eddy current is used. In the development, it is important to evaluate a high frequency permeability of the magnetic fine particles as a material.

Many methods have been developed for measurement of the high frequency permeability until now. Typical ones of them include (1) a method for determining the permeability of a magnetic substance based on a transmission coefficient by placing the magnetic substance on a signal line of a planar waveguide or a microstripline (see Non-Patent Document 1, for example); (2) a method for determining the permeability of a magnetic substance based on a reflection coefficient by placing the magnetic substance at a short-circuited end of a microstripline (see Patent Document 1, for example); (3) a method for determining the permeability of a magnetic material based on a counter electromotive force induced to a shielded loop coil by inserting the magnetic material into the shielded loop coil placed in a side open type of TEM cell (a high-frequency cavity) and injecting an excited alternating current to the TEM cell to excite movement of magnetization (see Patent Document 2, for example) and the like.

PRIOR ART DOCUMENT

Patent Document

Patent Document 1: Japanese Patent Application Laid-Open No. 2008-014920
Patent Document 2: Japanese Patent Application Laid-Open No. 2004-069337

Non-Patent Document

Non-Patent Document 1: Y. Chen et al., "Novel Ultra-Wide Band (10 MHz-26 GHz) Permeability Measurements for Magnetic Films", IEEE Trans. Magn., 2018, vol. 54, No. 11, 6100504

SUMMARY OF INVENTION

Technical Problem

According to the method using the transmission coefficient in Non-Patent Document 1 and the method using the reflection coefficient in Patent Document 1, however, a smaller amount of the counter electromotive force is generated by the magnetic material at a lower frequency side for an input signal, and it is difficult to separate a signal component caused by the counter electromotive force from the input signal, which may accordingly lead to a problem of reduction in measurement sensitivity. According to the structure of a jig where a shielded loop coil is disposed in the TEM cell of Patent Document 2 and a magnetic material is inserted into the shielded loop coil, it is difficult to miniaturize the TEM cell, which accordingly leads to a problem of difficulty of improvement of the measurement sensitivity.

An objective of the present invention is to solve the above-stated problems and provide a novel and useful permeability measurement jig and a permeability measurement device and a measurement method using the permeability measurement jig.

Solution to Problem

According to one aspect of the present invention, there is provided a permeability measurement jig, comprising: a first waveguide, wherein a signal line of the first waveguide comprises an excited magnetic part at one end side, and a magnetic field is generated at the excited magnetic part by an excitation signal; and a second waveguide, wherein a signal line of the second waveguide comprises a detection part at one end side, a detection signal is induced at the detection part due to an action of the magnetic field generated at the excited magnetic part to a measurement sample, and the detection part is placed above the excited magnetic part to face each other at a predetermined distance.

According to the above aspect, the permeability measurement jig is composed of the first waveguide and the second waveguide, and the excited magnetic part and the detection part as the signal lines can be miniaturized. Also, the excited magnetic part and the detection part can be easily placed near a sample, which can improve the measurement sensitivity of permeability. Also, a detection signal of the detection part is a signal caused by an induced electromotive force due to movement of magnetization of the measurement sample, and a signal caused by an excitation signal from the excited magnetic part is also added. Since the voltage of the signals due to the detection signal and the excitation signal is proportional to frequencies, the ratios are the same. As a result, the permeability measurement jig can achieve a constant measurement sensitivity across a whole measurement frequency and greatly restrain reduction in the measurement sensitivity at a lower frequency side.

According to another aspect of the present invention, there is provided a permeability measurement device, comprising: the permeability measurement jig according to the above aspect; a signal generation part that is coupled to an input part of the permeability measurement jig and generates the excitation signal; a signal analysis part that is coupled to an output part of the permeability measurement jig and analyzes the detection signal; and an arithmetic part that determines a permeability from the analyzed signal.

According to the above aspect, provision of the permeability measurement jig according to the above aspect to the permeability measurement device can enhance the measurement sensitivity and accordingly achieve a good signal to noise ratio (S/N ratio), which can measure the permeability of a sample of a fine magnetic powder substance.

According to a still further aspect of the present invention, there is provided a method of measuring a permeability by using the permeability measurement device according to the above aspect, comprising: setting a power level of an excitation signal per measurement band and inputting the excitation signal to measure a detection signal, wherein the signal generation part is controlled to provide the excitation signal of a higher power level at a lower frequency side to the input part of the permeability measurement jig than at a higher frequency side.

According to the above aspect, utilization of the permeability measurement jig according to the above aspect can enhance the measurement sensitivity and accordingly achieve a good signal to noise ratio (S/N ratio), and the measurement method that can measure the permeability of a fine magnetic powder substance can be provided. Also, by setting a higher power level of the excitation signal at a lower frequency side than at a higher frequency side, the power level of the detection signal can be increased at the lower frequency side, which can restrain reduction of the S/N ratio at the lower frequency side.

DESCRIPTION OF EMBODIMENTS

One embodiment of the present invention will be described below with reference to the drawings. Note that the same reference signs are attached to the same elements throughout the drawings, and repetition of detailed descriptions of the elements is omitted.

Figure 1:
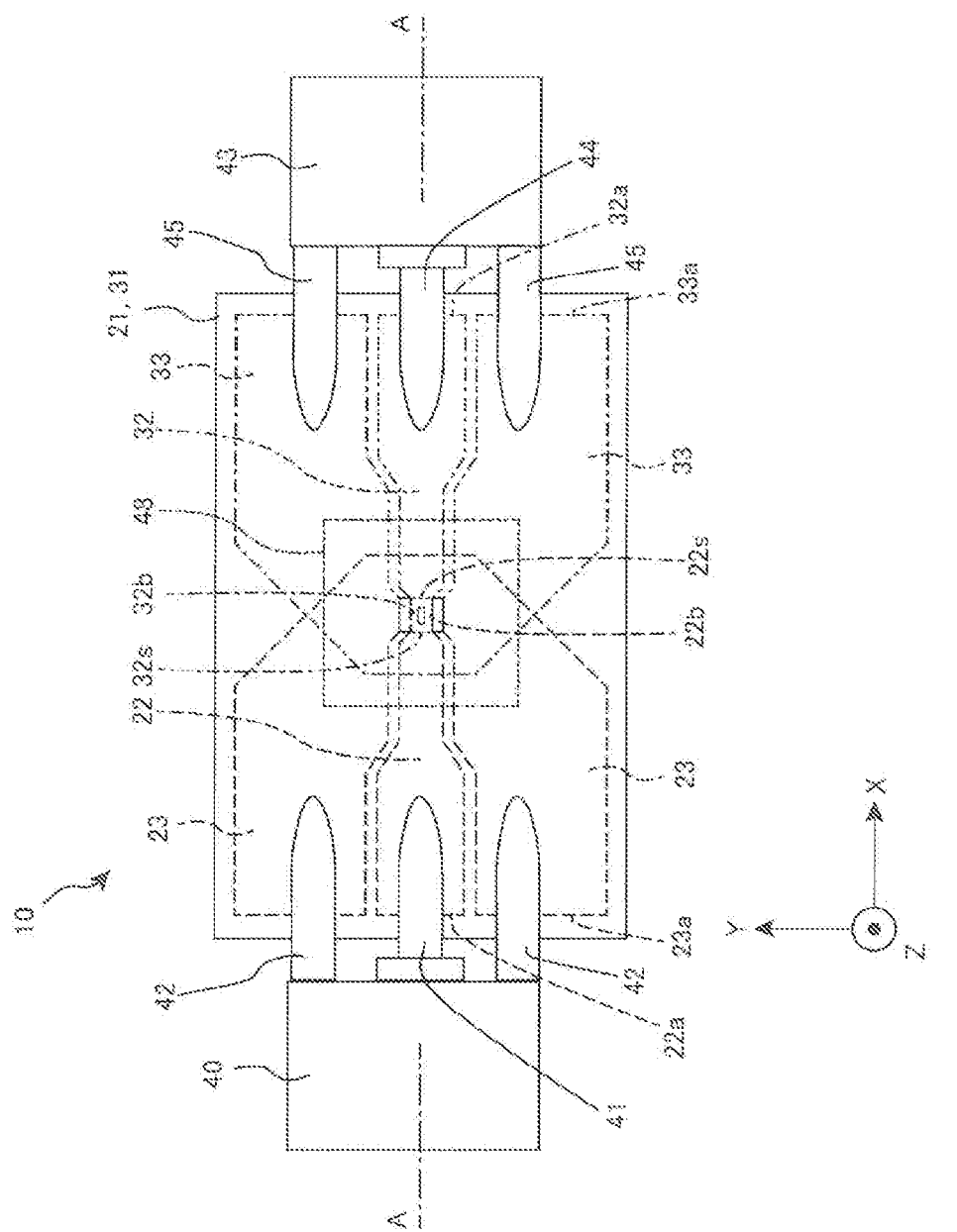
FIG. 1 is a top surface view illustrating a schematic structure of a permeability measurement jig according to one embodiment of the present invention.
Figure 2:
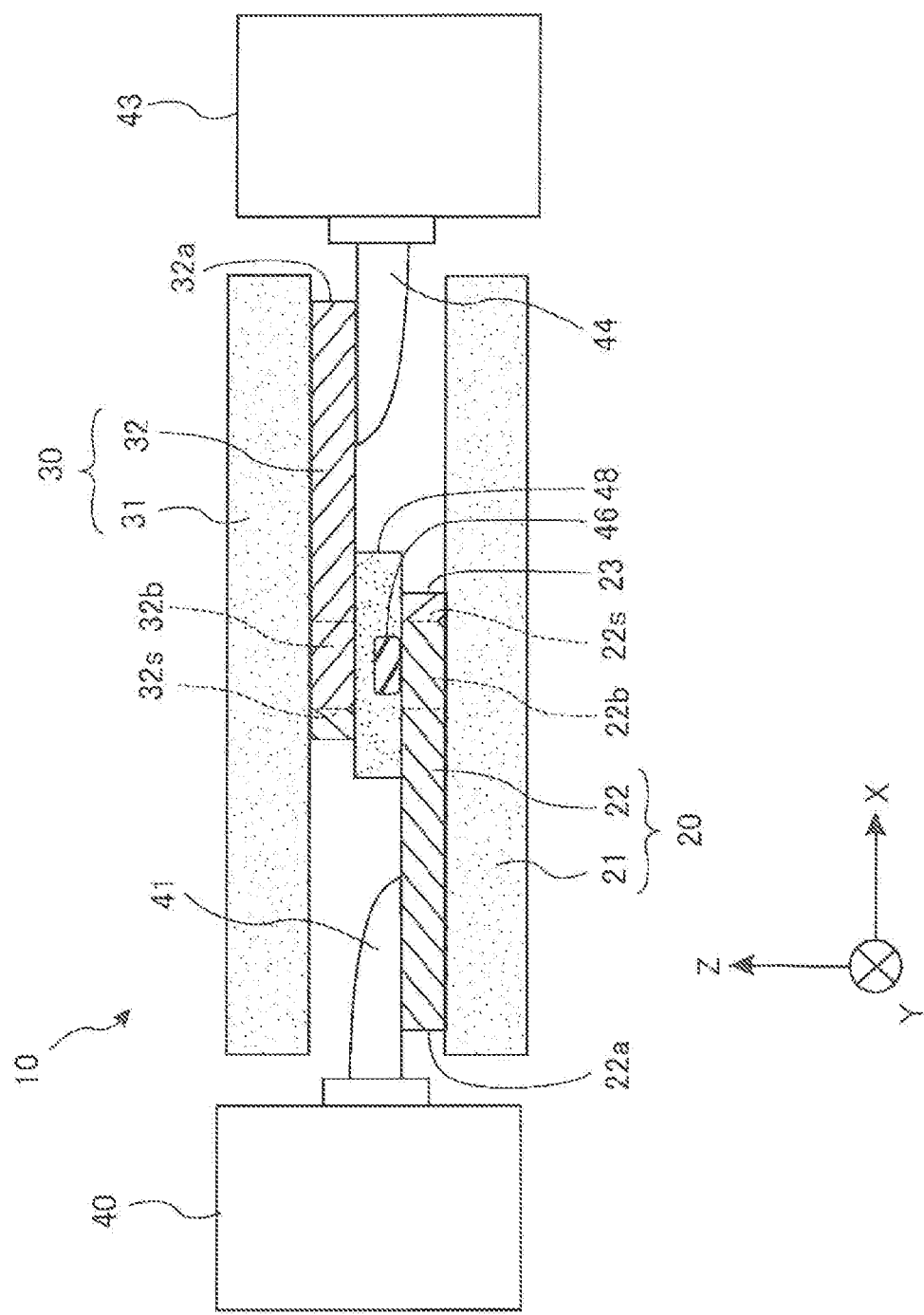
FIG. 2 is a cross sectional view illustrating the schematic structure of the permeability measurement jig according to one embodiment of the present invention.
Figure 3:
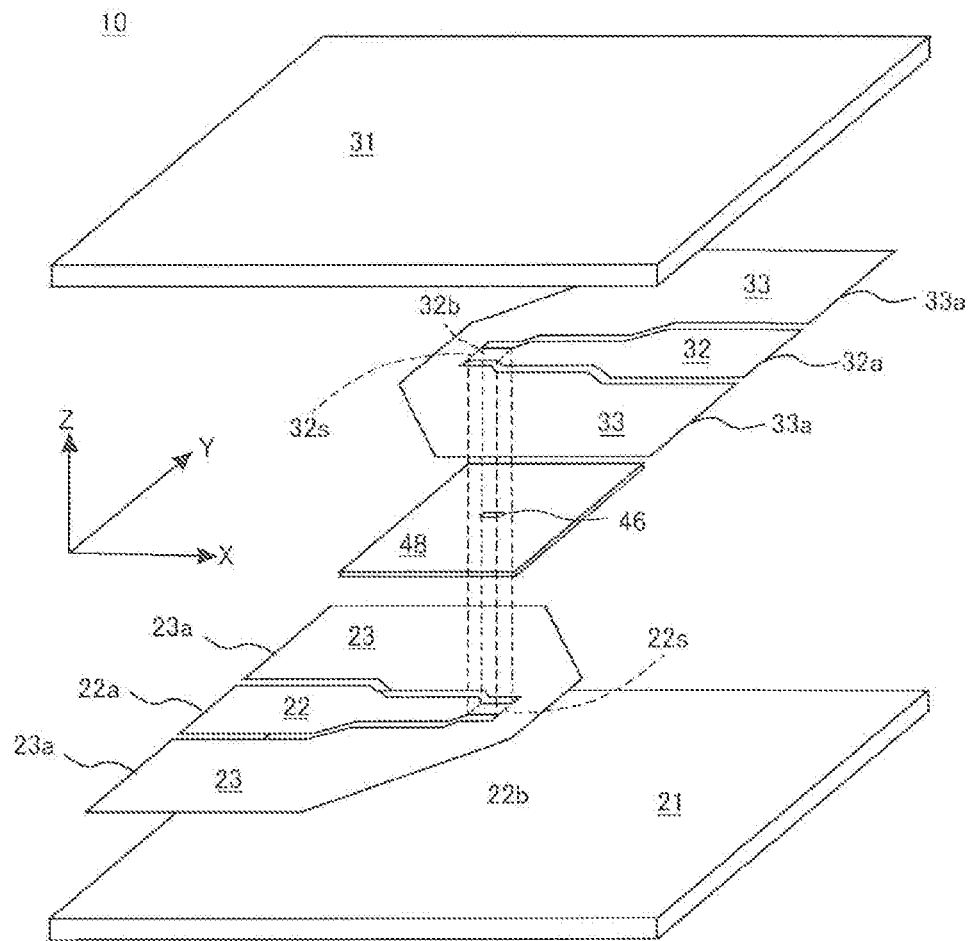
FIG. 3 is an exploded perspective view of a main part of the permeability measurement jig according to one embodiment of the present invention.

FIG. 1 is a top surface view illustrating a schematic structure of a permeability measurement jig according to one embodiment of the present invention, FIG. 2 is an A-A cross sectional view thereof, and FIG. 3 is an exploded perspective view of a main part thereof.

Referring to FIGS. 1 to 3, a permeability measurement jig 10 has an input waveguide 20 that transmits an excitation signal and an output waveguide 30 that transmits a detection signal as a counter electromotive force induced by a changing magnetic flux resulting from occurrence of movement of magnetization of a sample caused by a magnetic field excited by applying the excited magnetic field generated by a high frequency excitation signal to the sample. In the permeability measurement jig 10, the input waveguide 20 is transformer-coupled to the output waveguide 30. In this embodiment, the input waveguide 20 and the output waveguide 30 have Coplanar line structures. In the permeability measurement jig 10, the input waveguide 20 is disposed at the lower side of the drawing, and the output waveguide 30 is disposed at the upper side of the drawing, but they may be arranged upside down without limitations.

The input waveguide 20 has a signal line 22 and ground lines (earth lines) 23 at both sides thereof on a substrate 21 formed of a dielectric material. The signal line 22 extends from the side of an input part 22a of an excitation signal to a short-circuited end 22s coupled to the ground lines 23. The signal line 22 serves as an excited magnetic part 22b that generates a magnetic field for a portion of the short-circuited end 22s to apply to a sample 46. The sample is disposed onto the excited magnetic part 22b. The excited magnetic part 22b extends in the direction (X-axis direction) of transmission of the excitation signal by a predetermined width.

The signal line 22 is formed to gradually decrease the width thereof from the input part 22a of the excitation signal to the excited magnetic part 22b. Since a signal line 41 of a coaxial cable 40 is coupled to the side of the input part 22a of the excitation signal in the signal line 22, the signal line 22 is formed to be of a greater width at that coupling portion than the width of the excited magnetic part 22b. The signal line 22 is formed such that the width may be smaller at two portions toward the excited magnetic part 22b, but it is not limited to this embodiment. For example, the signal line 22 may be formed to be wider only at a portion coupled to the coaxial cable 40 at the side of the input part 22a and to have the same width as the excited magnetic part 22b at the other portions, and the signal line 22 may be formed to be narrower by a predetermined rate in the length direction (X-axis direction) until the excited magnetic part 22b.

The ground lines 23 are provided to both sides of the signal line 22 at the side of the input part 22a and are coupled to respective ground lines 42 of the coaxial cable 40. The ground lines 23 are formed in separation from the side portions of the signal line 22 by a predetermined distance. The ground lines 23 are united at a short-circuited end 22s of the excited magnetic part 22b. The ground line 23 is formed to be gradually narrower (the length of Y direction) toward its tip in the planar view, which is preferred from the standpoint of reduction in capacity coupling to the ground line 33 of the output waveguide 30.

Similar to the input waveguide 20, the output waveguide 30 has a signal line 32 and ground lines 33 at both sides thereof on a substrate 31 formed of a dielectric material. The signal line 32 extends from the side of an output part 32a of a detection signal to a short-circuited end 32s coupled to the ground lines 33. The signal line 32 serves as a detection part 32b that detects a magnetic flux generated by applying a magnetic field at a portion of the short-circuited end 32s to a sample. The detection part 32b is placed to face the excited magnetic part 22b in parallel in separation of a predetermined distance, and a sample 46 is disposed between the detection part 32b and the excited magnetic part 22b. The detection part 32b extends in the length direction (X-axis direction) in a predetermined width.

The signal line 32 is formed such that the width thereof is enlarged from the detection part 32b to the side of the output part 32a of the detection signal. Since a signal line 44 of a coaxial cable 43 is connected to the side of the output part 32a of the detection signal in the signal line 32, the width of the signal line 32 at the connection portion is formed to be greater than that of the detection part 32b. The signal line 32 is formed to be narrower at two portions toward the detection part 32b, but the signal line 32 is not limited to this embodiment. For example, the signal line 32 may be formed to be wider only at a portion where the signal line 44 of the coaxial cable 43 of the output side is connected, and the other portions may be formed to have the same width as the detection part 32b and to be narrowed at a predetermined rate toward the length direction (X-axis direction) until the detection part 32b.

The ground lines 33 are formed similar to the ground lines 23 of the input waveguide 20 and are coupled to the ground lines 45 of the coaxial cable 43. For the ground lines 33, it is preferred from the standpoint of reduction in capacity coupling that they have a smaller overlapping area with the ground lines 23 of the input waveguide 20 in the planar view.

It is preferred from the standpoint of the measurement sensitivity that the excited magnetic part 22b and the detection part 32b are formed such that the facing length (the length of X-axis direction) along the direction (X-axis direction) of transmission of the excitation signal and the detection signal may be smaller than or equal to 10 mm, and it is preferred from the standpoint of placement of the sample 46 and facilitation of overlapping between the excited magnetic part 22b and the detection part 32b to face each other that the facing length may be greater than or equal to 0.1 mm. Furthermore, the above length of the excited magnetic part 22b and the detection part 32b with respect to the X-axis direction may be greater than or equal to 10 nm. By using fine processing techniques such as a semiconductor process technique for fabrication of the excited magnetic part 22b and the detection part 32b and placement of samples, the permeability of a microscopic sample of several nms in size can be measured at a high sensitivity.

The signal lines 22, 32 and the ground lines 23, 33 in the input waveguide 20 and the output waveguide 30 may be formed of a conductive material such as copper, and the thickness may be 35 μm, for example. The substrates 21 and 31 may be formed of a glass cloth base epoxy resin laminate (glass epoxy), and the thickness may be 1.6 mm, for example. The input waveguide 20 and the output waveguide 30 may be formed to have a transmission impedance of 50Ω, for example.

In the permeability measurement jig 10, a non-magnetic insulation layer 48 may be provided between the excited magnetic part 22b and the detection part 32b in order to separate the excited magnetic part 22b from the detection part 32b by a predetermined distance. The non-magnetic insulation layer 48 may have an adhesive material on the front surface to fix the sample 46 onto the excited magnetic part 22b, for example. The non-magnetic insulation layer 48 may be formed of a polyimide tape having an adhesive agent, for example.

Figure 4A:
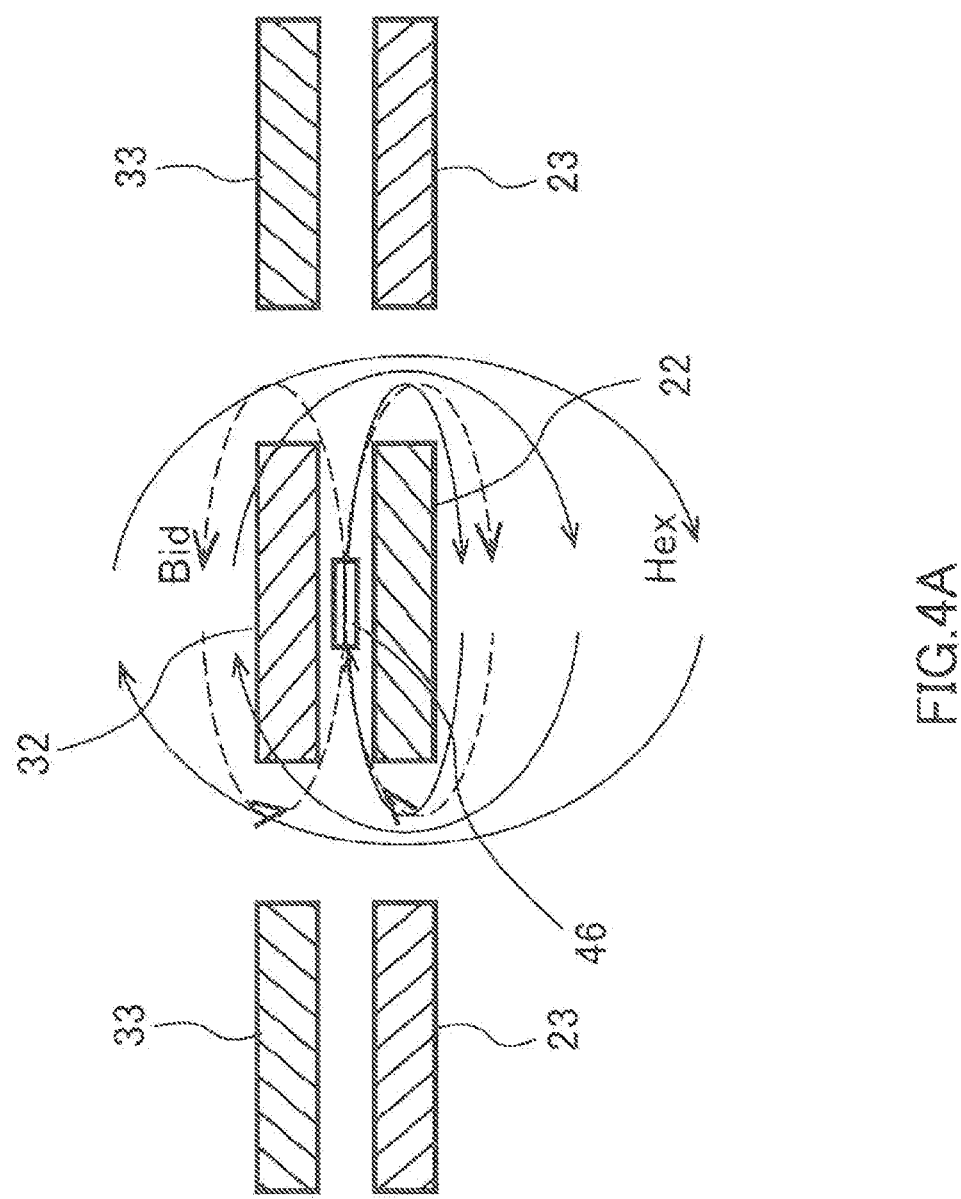
FIGS. 4A and 4B are diagrams for illustrating a sample placement and a measurement principle for the permeability measurement jig according to one embodiment of the present invention.
Figure 4B:
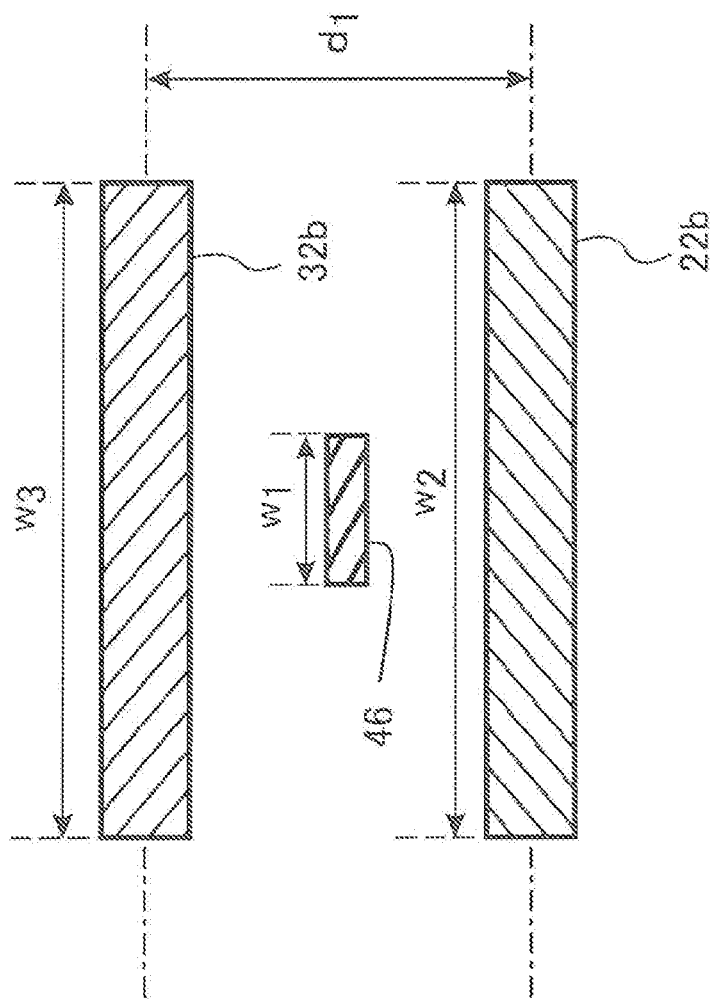

FIG. 4 is a diagram for illustrating a measurement principle for a permeability measurement jig according to one embodiment of the present invention. FIG. 4A illustrates a cross sectional view of the excited magnetic part 22b and the detection part 32b along Y direction in FIGS. 1 to 3, and FIG. 4B is an enlarged view of the excited magnetic part 22b and the detection part 32b in FIG. 4A. Note that illustration of the substrates 21, 31 and the non-magnetic insulation layer 48 is omitted in FIGS. 4A and 4B for convenience of explanation.

Referring to FIG. 4A, it is assumed that an excitation signal flows from the front side to the inner side in the illustration in the excited magnetic part 22b. The excitation signal generates an excited magnetic field $H_{ex}$ in the surrounding area of the excited magnetic part 22b. Since the sample is a ferromagnetic body, applying the excited magnetic field $H_{ex}$ to a sample generates a magnetic flux $B_{id}$ due to movement of the magnetization, which results in an induced electromotive force at the detection part 32b, and a detection signal is generated.

Referring to FIG. 4B, it is preferable from the standpoint of increase in excitation efficiency that the width $w_2$ of the excited magnetic part 22b is almost the same as the width $w_1$ of the sample (substantially the same ($w_1 \approx w_2$)), and it is more preferable that they are substantially the same. It is preferable from the standpoint of increase in the detection sensitivity that the width $w_3$ of the detection part 32b is also almost the same as the width $w_1$ of the sample (substantially the same ($w_1 \approx w_3$)). It is preferred that the widths $w_2$ and $w_3$ are greater than or equal to 0.1 mm to facilitate placement of the sample 46 and superposition to face the excited magnetic part 22b and the detection part 32b each other. It is preferred that the distance $d_1$ (the distance of a center line) of the excited magnetic part 22b and the detection part 32b is smaller than the width $w_2$ of the excited magnetic part 22b and the width $w_3$ of the detection part 32b in terms of the measurement sensitivity ($d_1 < w_1$, $w_2$). Furthermore, the widths $w_2$ and $w_3$ may be greater than or equal to 10 nm. Fine processing techniques such as a semiconductor process technique can be used for fabrication of the excited magnetic part 22b and the detection part 32b and placement of samples, which can measure the permeability of a microscopic sample of several nms in size at a high sensitivity.

The sample 46 may be placed to refrain from contacting the surfaces of the excited magnetic part 22b and the detection part 32b or to contacting any of the surfaces. Note that the excited magnetic part 22b may not contact the detection part 32b directly.

Figure 5:
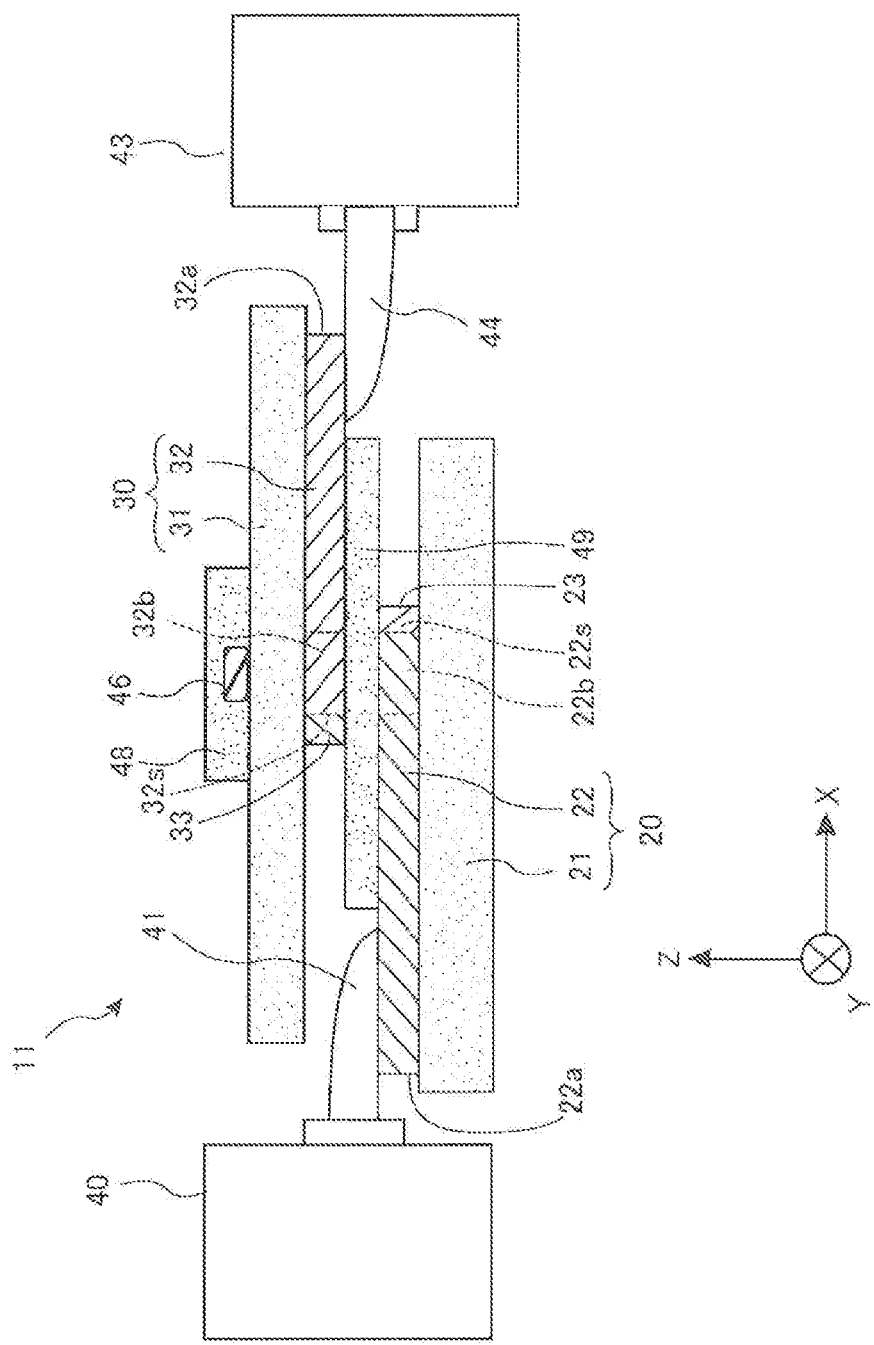
FIG. 5 is a cross sectional view illustrating a sematic structure of an exemplary variation of the permeability measurement jig according to one embodiment of the present invention.

FIG. 5 is a cross sectional view illustrating a schematic structure of an exemplary variation of a permeability measurement jig according to one embodiment of the present invention. Referring to FIG. 5, for a permeability measurement jig 11, the sample 46 is placed on the surface opposite to the signal line 32 of the substrate 31 of the output waveguide 30. The permeability measurement jig 11 has a structure where the signal line 22 of the input waveguide 20 faces the signal line 32 of the output waveguide 30, and the excited magnetic part 22b and the detection part 32b face each other at a predetermined distance via the non-magnetic insulation layer 49. The permeability measurement jig 11 has the same structure as that in FIGS. 1 to 3 except the above structure. The sample 46 is placed at a position where the excited magnetic part 22b overlaps with the detection part 32b in the planar view. Note that an insulation layer may be formed on the signal line 32 and the ground line 33 instead of the substrate 31, or the sample 46 may be placed on the detection part 32b with omission of the substrate 31.

Figure 6:
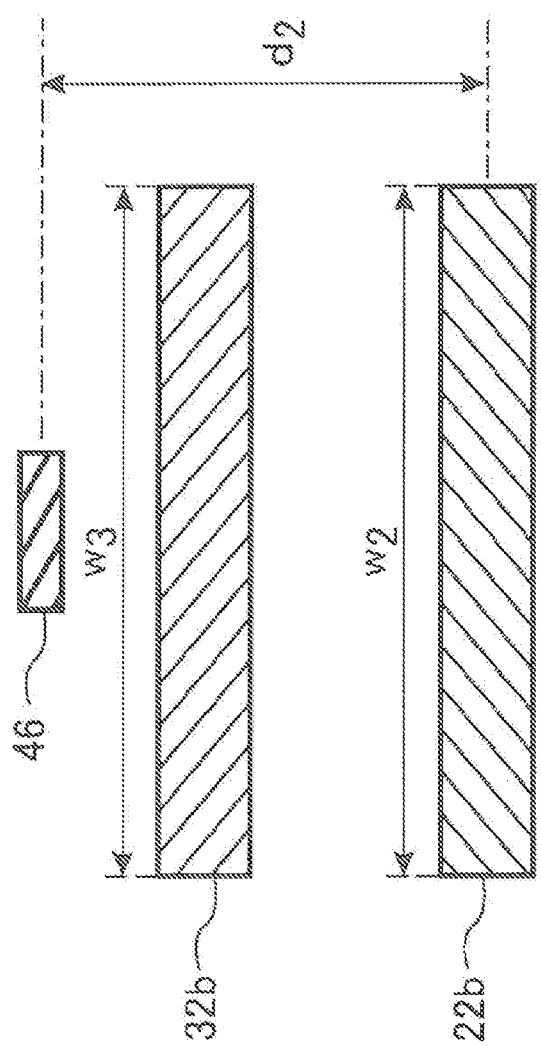
FIG. 6 is a diagram for illustrating a sample placement of an exemplary variation of the permeability measurement jig according to one embodiment of the present invention.

FIG. 6 is a diagram for illustrating a sample placement for the permeability measurement jig illustrated in FIG. 5. FIG. 6 illustrates a cross sectional view of the excited magnetic part 22b and the detection part 32b along the Y direction in FIG. 5. Referring to FIG. 6 together with FIG. 5, the sample 46 is placed at the upper side of the detection part 32b (at the side opposite to the excited magnetic part 22b of the detection part 32b). In this case, the distance $d_2$ between the center position of the excited magnetic part 22b and the position of the sample 46 is preferably smaller than the width $w_2$ of the excited magnetic part 22b and the width $w_3$ of the detection part 32b ($d_2 < w_2, w_3$).

Figure 7:
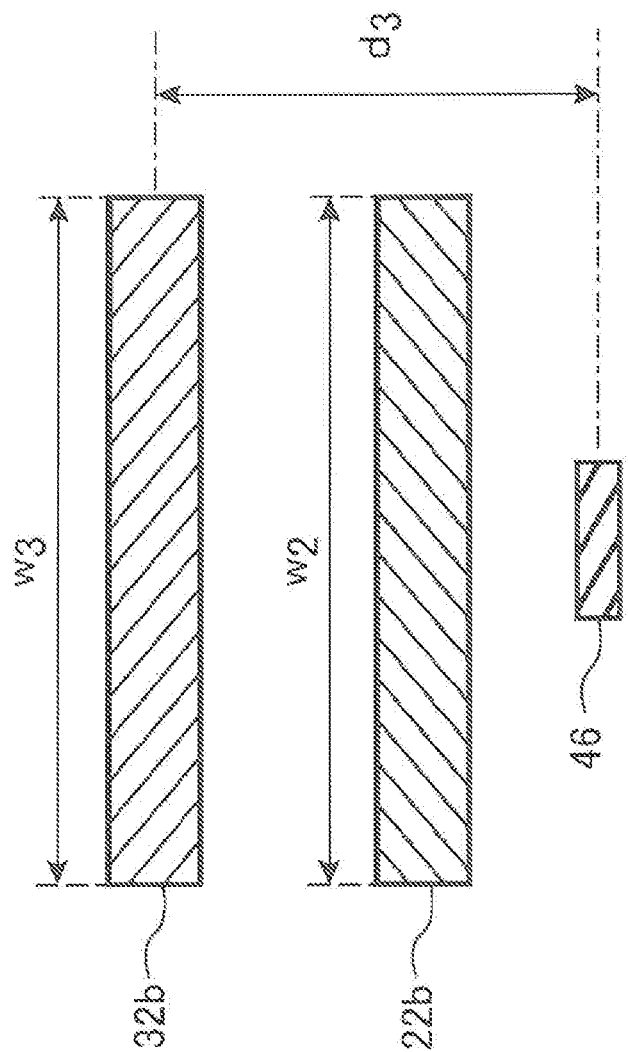
FIG. 7 is a diagram for illustrating a sample placement of another exemplary variation of the permeability measurement jig according to one embodiment of the present invention.

FIG. 7 is a diagram for illustrating another example of another variation of a sample placement for the permeability measurement jig. Referring to FIG. 7, the sample 46 may be placed at the lower side of the excited magnetic part 22b (the side opposite to the detection part 32b of the excited magnetic part 22b). In this case, the permeability measurement jig can be structured by turning the permeability measurement jig 11 illustrated in FIG. 5 upside down. The distance $d_3$ between the center position of the detection part 32b and the position of the sample 46 is preferably smaller than the width $w_2$ of the excited magnetic part 22b and the width $w_3$ of the detection part 32b ($d_3 < w_2, w_3$).

Figure 8:
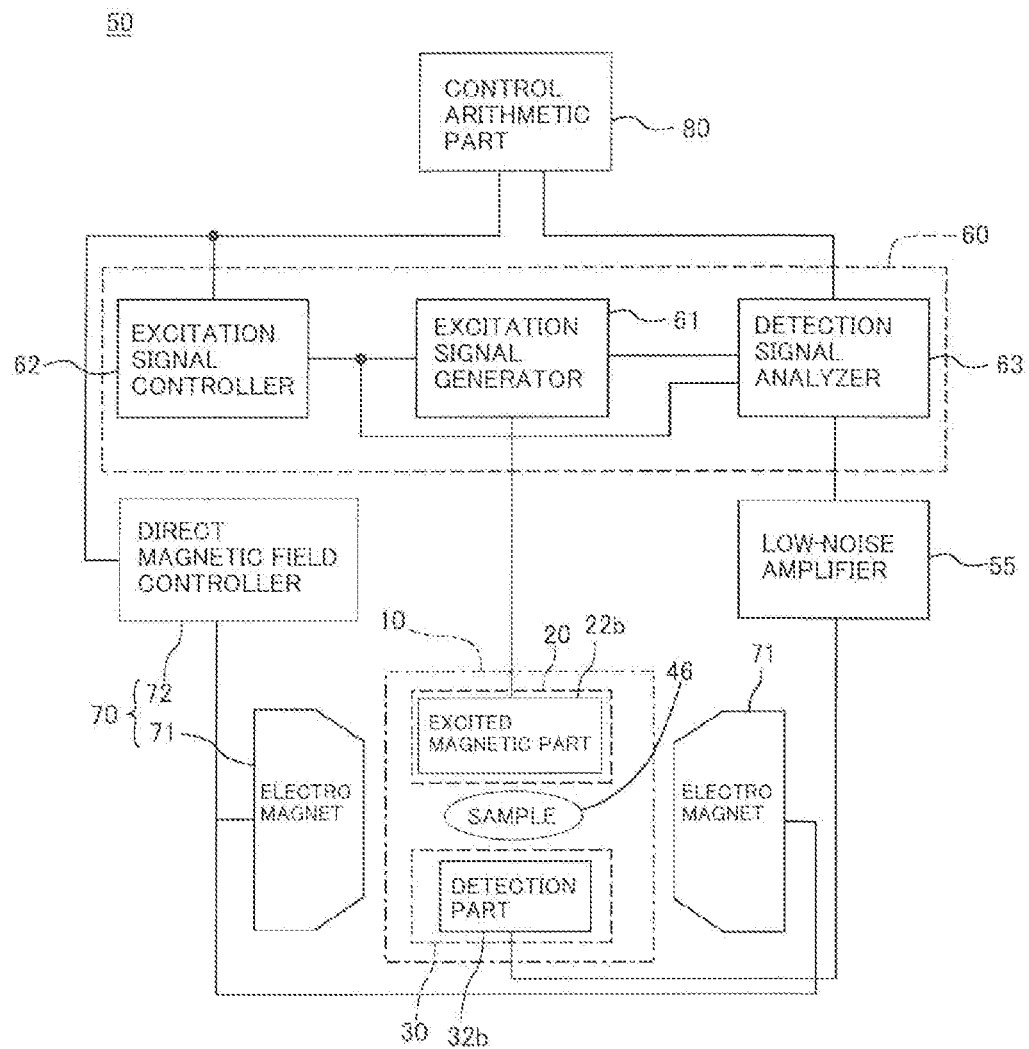
FIG. 8 is a diagram illustrating a schematic structure of a permeability measurement device according to one embodiment of the present invention.

FIG. 8 is a diagram for illustrating a schematic structure of a permeability measurement device according to one embodiment of the present invention. Referring to FIG. 8, a permeability measurement device 50 generally has a permeability measurement jig 10, a low-noise amplifier 55, a signal generation analysis part 60, a direct current magnetic field generation part 70 and a control arithmetic part 80.

The permeability measurement jig 10 is the permeability measurement jig 10 illustrated in FIGS. 1 to 3 or the permeability measurement jig 11 illustrated in FIG. 5 according to the above embodiments or may be a permeability measurement jig 100 according to embodiments illustrated in FIGS. 11 and 12 as stated below.

The low-noise amplifier 55 is coupled to the output part of the output waveguide 30 of the permeability measurement jig 10 to amplify a detection signal. The low-noise amplifier 55 may be a commercially available low-noise amplifier and preferably have a constant amplification factor in a whole measurement band, and the noise of itself is as low as possible. It is preferred that the amplification factor of the low-noise amplifier 55 can be higher than the noise factor of a detector (not shown) of a detection signal analyzer 63 in order to restrain the effect of the noise factor of the detector and improve the comprehensive S/N ratio. The amplification factor may range from 25 dB to 30 dB, for example. Notably, it is not essential but preferable that the low-noise amplifier 55 may be used for the permeability measurement device 50.

The signal generation analysis part 60 has an excitation signal generator 61 that generates an excitation signal supplied to the input waveguide 20 of the permeability measurement jig 10, an excitation signal controller 62 that controls the power and frequency of the excitation signal of the excitation signal generator 61 and a detection signal analyzer 63 that receives and analyzes a detection signal amplified by the low-noise amplifier 55. The signal generation analysis part 60 may be a commercially available vector network analyzer (VNA), for example.

The direct current magnetic field generation part 70 has an electromagnet 71 and a direct current magnetic field controller 72 that controls the electromagnet 71. The electromagnet 71 is controlled by the direct current magnetic field controller 72 to generate a magnetic field applied to the sample 46 for the permeability measurement jig 10 placed between one pair of magnetic poles. The amount of the magnetic field applied by the electromagnet 71 may be appropriately selected corresponding to the sample 46 and may be at most about 2 Ts (Teslas), for example. Note that a permanent magnet may be used instead of the electromagnet 71. For example, permanent magnets having several different residual magnetic flux densities may be used in combinations as needed.

The control arithmetic part 80 controls the signal generation analysis part 60 and the direct current magnetic field controller 72 to receive frequency characteristic data for S parameters from the detection signal analyzer 63 and calculate the complex permeability. Although not illustrated, the control arithmetic part 80 has a semiconductor memory that stores data, a display, a keyboard and a mouse. The control arithmetic part 80 may be a personal computer (PC), for example.

Figure 9:
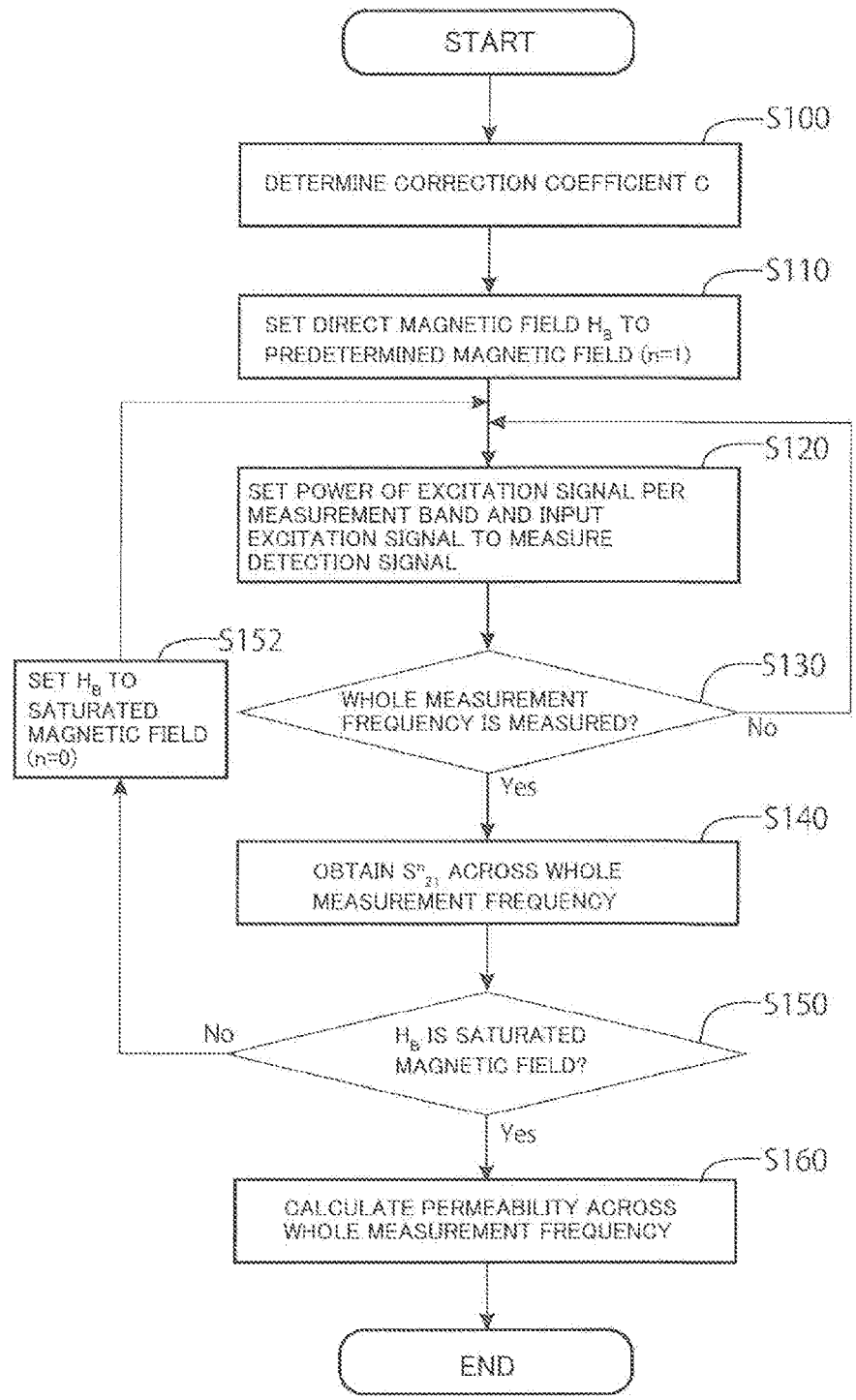
FIG. 9 is a flowchart illustrating a permeability measurement method according to one embodiment of the present invention.

FIG. 9 is a flowchart illustrating a permeability measurement method according to one embodiment of the present invention. The permeability measurement method is described with reference to FIG. 9 together with FIG. 8.

The permeability μ is represented as formula (1) as follows, $$\mu = C \frac{s_{21}^1 - s_{21}^0}{s_{21}^1 + s_{21}^0} + 1, \tag{1}$$

where C is a correction coefficient specific to the permeability measurement jig 10 and the sample 46, the lower suffix "21" of the S parameters represents transmission S parameters from the input side to the output side of the permeability measurement jig 10, the upper suffix "0" (n=0) of the S parameters represents transmission S parameter in a magnetic field where magnetization of a sample is saturated, and the upper suffix "1" of the S parameters (n=1) represents transmission S parameters in a predetermined magnetic field. The predetermined magnetic field may be a direct current magnetic field applied to the sample in an installation environment of the sample, for example. If the sample is used for a noise suppression sheet provided to a housing where an electronic substrate is accommodated, the predetermined magnetic field may be set to 0 (zero) T (Tesla), for example.

At step S100, the correction coefficient C is first determined. Specifically, the sample 46 is installed to the permeability measurement jig 10, and a direct current magnetic field is applied to the sample 46 by means of the electromagnet 71. An excitation signal having a predetermined frequency (low frequency) is input to the permeability measurement jig 10, and a detection signal is measured at the detection signal analyzer 63 for measurement for the transmission S parameter $S''_{21}$. Several amounts of the direct current magnetic field are selected within the range where magnetization of the sample is sufficiently saturated, and the transmission S parameter $S''_{21}$ is measured for the direct current magnetic field $H_B$ having the respective amounts. Then, the correction coefficient C in the above formula (1) is determined by fitting a theoretical formula $\mu = M_S/H_B + 1$ (where $M_s$ is saturated magnetization for the sample) based on $S''_{21}$ measured by the control arithmetic part and the amount of the applied direct current magnetic field $H_B$.

Then, at step S110, the direct current magnetic field $H_B$ of the electromagnet 71 is set by the direct current magnetic field controller 72 to a predetermined magnetic field (n=1), and the electromagnet 71 applies the direct current magnetic field $H_B$ to the sample placed at the permeability measurement jig 10. The permeability measurement jig 10 is disposed such that the direct current magnetic field $H_B$ can be applied in parallel to the direction of the excitation signal flowing into the excited magnetic part 22b. Note that the saturated magnetic field described below is also applied in the same direction. The direct current magnetic field $H_B$ corresponds to the case where the upper suffix of the S parameters is "1" in the above formula (1).

Then, at step S120, the power of the excitation signal is set per measurement band so as to input the excitation signal and measure a detection signal. Specifically, the whole frequency band measured for the permeability is divided into multiple measurement bands, and the power level of the excitation signal is set for the respective measurement bands.

Then, the excitation signal is input to the permeability measurement jig 10 to measure the output detection signal.

Figure 10:
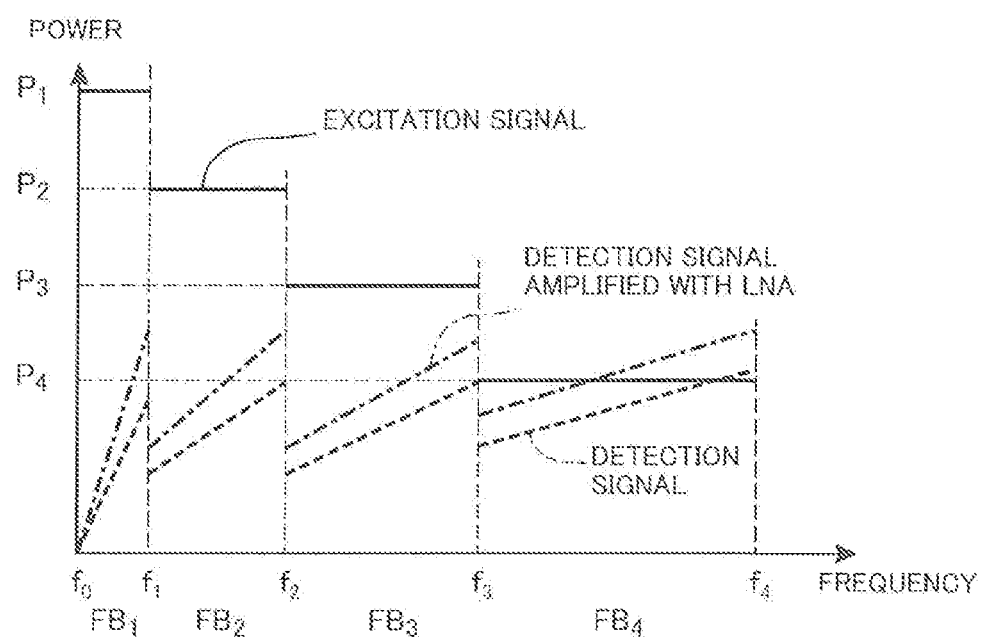
FIG. 10 is a diagram for illustrating a setting of an excitation signal and a characteristic of a detection signal in the permeability measurement method according to one embodiment of the present invention.

FIG. 10 is a diagram for illustrating a setting of the excitation signal and a characteristic of the detection signal in the permeability measurement method according to one embodiment of the present invention. Referring to FIG. 10, the excitation signal divides a frequency measured for the permeability, for example, the whole measurement band ranging from $f_0$ to $f_4$ of 1 MHz to 50 GHz, into multiple bands, for example, four bands $FB_1$ to $FB_4$. For the respective bands $FB_1$ to $FB_4$, the power level of the excitation signal is set to $P_1$ to $P_4$ as illustrated in the solid line in FIG. 10. The excited magnetic field generated at the excited magnetic part 22b in response to the excitation signal is applied to the sample 46, and a detection signal is induced at the detection part 32b as a counter electromotive force based on variations of the magnetic flux occurring in response to movement of magnetization of the sample. The detection signal is illustrated in the dotted line in FIG. 10. If the power level of the excitation signal is constant across the whole measurement band, the power level of the detection signal is lower for lower frequency bands based on its characteristics. Furthermore, since the power level of Johnson noise is constant across the frequency, the S/N ratio is more strongly influenced at the lower frequency side. In the present embodiment, the power level $P_i$ of the excitation signal is set to be higher at the lower frequency side than at the higher frequency side. As a result, by increasing the power level of the detection signal at the lower frequency side, the detection signal having almost the same power level can be obtained across the whole measurement band. Accordingly, reduction in the S/N ratio at the lower frequency side due to Johnson noise can be restrained without saturation of the detection signal analyzer 63, that is, without saturating the output beyond the input power range of a detector of the detection signal analyzer 63.

Furthermore, the detection signal is amplified by the low-noise amplifier 55, and the amplified detection signal is illustrated in the alternate long and short dashed line in FIG. 10. As a result, by increasing the power level of the detection signal at the lower frequency side, the reduction in the S/N ratio at the lower frequency side due to Johnson noise can be further restrained without saturating the low-noise amplifier 55 and the detection signal analyzer 63.

Referring back to FIG. 9, at step S130, it is determined whether the whole measurement frequency has been measured. If the whole measurement frequency has not been measured (the case of "No"), S120 is repeated until completion of the measurement. If the whole measurement frequency has been measured (the case of "Yes"), the flow proceeds to step S140.

Then, at step S140, the S parameter $S^1_{21}$ in a predetermined magnetic field across the whole measurement frequency is obtained from data of the detection signal amplified at the above S120.

Then, at step S150, it is determined whether the direct current magnetic field $H_B$ due to the electromagnet 71 corresponds to the magnetic field (saturated magnetic field) where magnetization of the sample 46 is saturated. If the direct current magnetic field $H_B$ does not correspond to the saturated magnetic field (the case of "No"), the flow proceeds to step S152, and if the direct current magnetic field $H_B$ corresponds to the saturated magnetic field (the case of "Yes"), the flow proceeds to step S160.

At step S152, the applied magnetic field $H_B$ of the electromagnet 71 is set by the direct current magnetic field controller 72 to the saturated magnetic field (n=0). The saturated magnetic field is set to a sufficiently larger amount of magnetic field that can saturate magnetization of the sample and reduce the movement of magnetization for the excited magnetic field alternating in a high frequency by the excitation signal. The saturated magnetic field corresponds to the case where the upper suffix of the S parameters are "0" in the above formula (1). Then, S120 and S130 are performed by applying the saturated magnetic field, and at step S140, the S parameter $S^0_{21}$ in a predetermined magnetic field across the whole measurement frequency in the saturated magnetic field is obtained from data of the detection signal amplified at S120.

At step S160, the permeability across the whole measurement frequency is calculated. Specifically, the control arithmetic part 80 receives the S parameters $S^0_{21}$ and $S^1_{21}$ from the detection signal analyzer 63 and uses the correction coefficient C calculated at S100 to determine the complex permeability in accordance with the above formula (1). The control arithmetic part 80 can store the determined complex permeability in a memory, a hard disk drive, a cloud or the like and display it on a display or print out it with a printer.

The permeability measurement method as stated above may be performed by the control arithmetic part 80 as a software program or be used to configure the control arithmetic part 80 as hardware. According to the permeability measurement method, the control arithmetic part 80 can control the signal generation analysis part 60 and the direct current magnetic field generation part 70 to measure the permeability.

As an exemplary variation of the above-stated measurement method, the power level of the excitation signal is set to be constant across the whole measurement band at S120 for measurement of the detection signal.

According to the present embodiment, the input waveguide 20 and the output waveguide 30 in the permeability measurement jig 10 have Coplanar line structures, and the excited magnetic part 22b and the detection part 32b serving as signal lines can be miniaturized. Since the excited magnetic part 22b and the detection part 32b can be easily placed adjacent to a fine magnetic powder substance, the measurement sensitivity of the permeability can be improved. The excited magnetic part 22b and the detection part 32b are end portions that are short-circuited with the ground lines 23 and 33, respectively, and are placed to face each other, which can restrain the effect of an electric field. Although the detection signal of the detection part 32b is a signal caused by an induced electromotive force due to the movement of magnetization of the sample 46, a signal due to the effect of the excitation signal from the excited magnetic part 22b is also added. Since the voltage of the signals due to the excitation signal and the detection signal is proportional to frequencies, the ratios are the same. Accordingly, the permeability measurement jig 10 can obtain a constant measurement sensitivity across the whole measurement frequency. The permeability measurement jig 10 can greatly restrain reduction in the measurement sensitivity caused at a lower frequency side in the measurement devices disclosed in Patent Document 1 and Non-Patent Document 1.

According to the present embodiment, the permeability measurement jig 10 is provided to the permeability measurement device 50, and the permeability of fine magnetic powder substances can be measured because of s higher measurement sensitivity and a better S/N ratio. Also, the power level of the detection signal at the lower frequency side is increased by setting the power level $P_i$ of the excitation signal to be higher at the lower frequency side than at the higher frequency side, and accordingly the detection signal can have almost the same power level cross the whole measurement band. As a result, reduction in the S/N ratio at the lower frequency side caused by Johnson noise can be restrained.

According to the permeability measurement method of the present embodiment, usage of permeability measurement jog 10 leads to the higher measurement sensitivity and the better S/N ratio, which allows the permeability of fine magnetic powder substances to be measured. Also, the power level of the detection signal at the lower frequency side is increased by setting the power level $P_i$ of the excitation signal to be higher at the lower frequency side than at the higher frequency side, which can obtain the detection signal having almost the same power across the whole measurement band and restrain reduction in the S/N ratio at the lower frequency side.

One embodiment is described below as an exemplary variation of the above permeability measurement jig 10.

Figure 11:
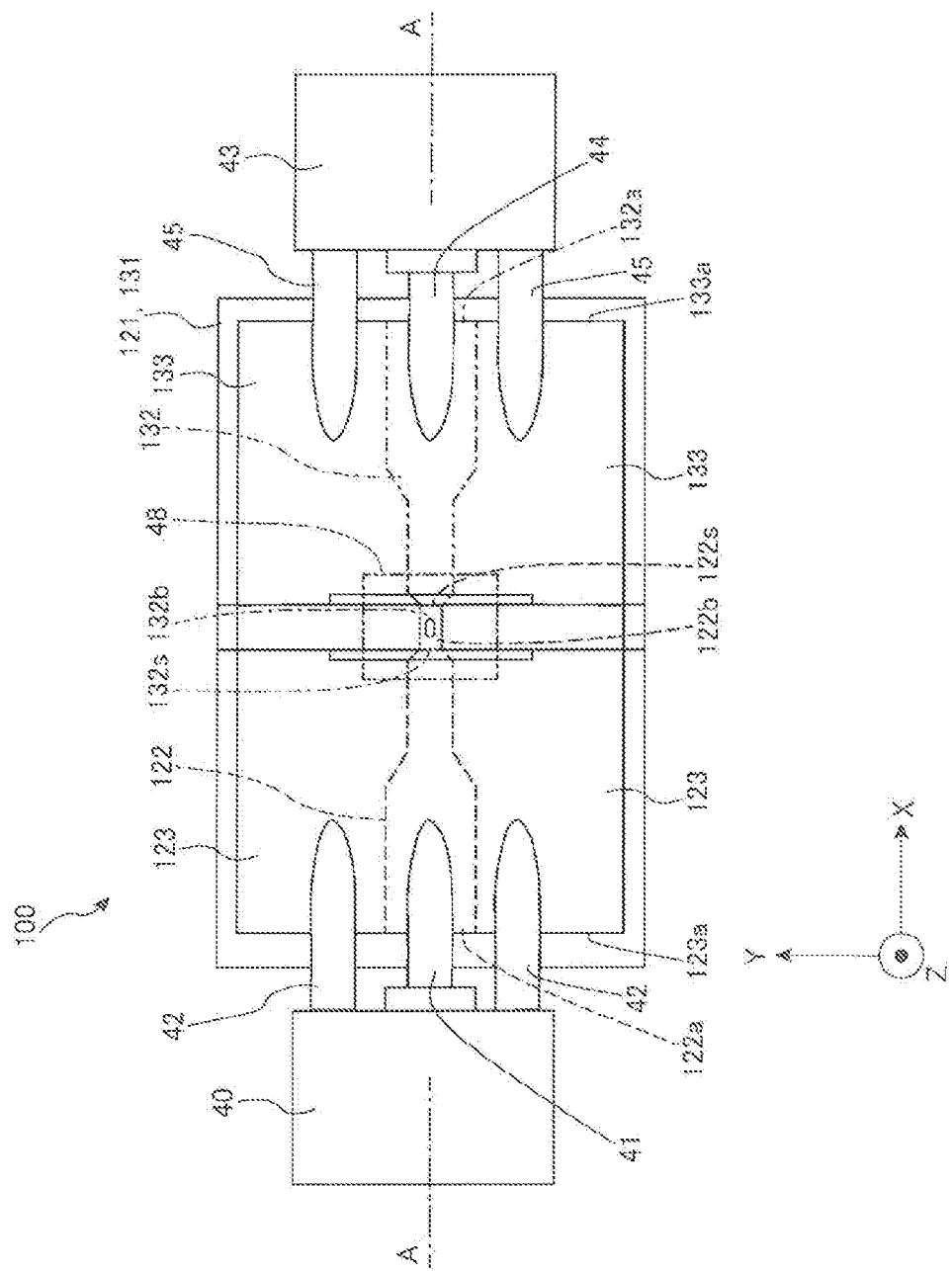
FIG. 11 is a top surface view illustrating a schematic structure of a permeability measurement jig according to another embodiment of the present invention.
Figure 12:
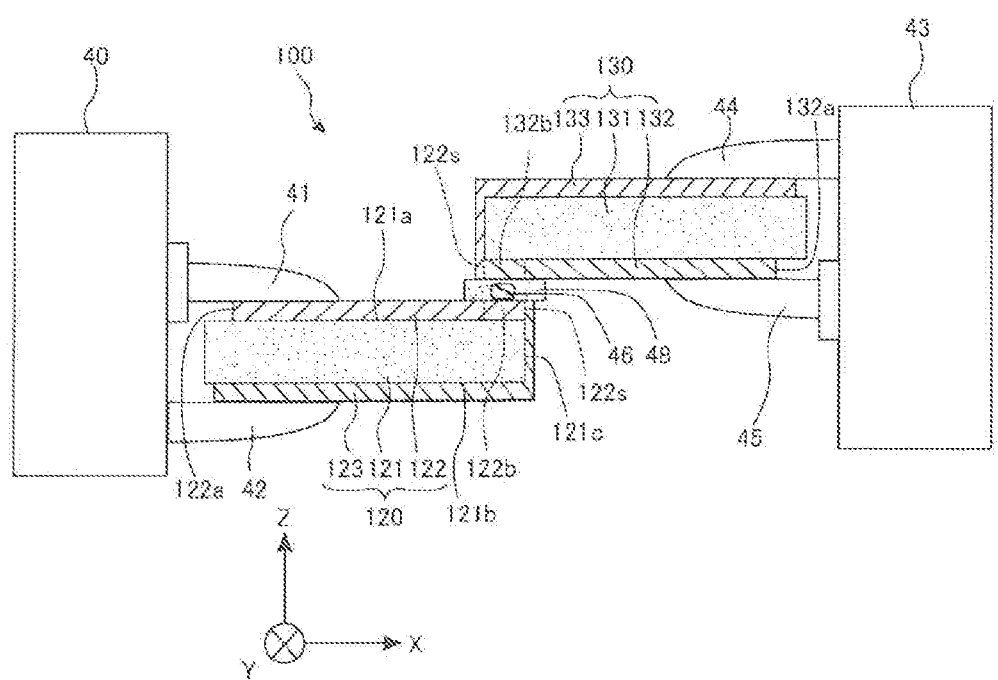
FIG. 12 is a cross sectional view illustrating the schematic structure of the permeability measurement jig according to another embodiment of the present invention.

FIG. 11 is a top surface view illustrating a schematic structure of a permeability measurement jig according to another embodiment of the present invention, and FIG. 12 is an A-A cross sectional view thereof.

Referring to FIGS. 11 and 12, a permeability measurement jig 100 has an input waveguide 120 that transmits an excitation signal and an output waveguide 130 that transmits a detection signal as a counter electromotive force induced by a changing magnetic flux resulting from occurrence of movement of magnetization of the sample 46 caused by a magnetic field excited by applying the excited magnetic field generated by a high frequency excitation signal to the sample 46. In the present embodiment, the input waveguide 120 and the output waveguide 130 have microstripline structures. In the permeability measurement jig 100, the input waveguide 120 is disposed at the lower side of the drawing, and the output waveguide 130 is disposed at the upper side of the drawing, but they may be arranged upside down without limitations.

The input waveguide 120 has a signal line 122 on a main surface 121a of a substrate 121 formed of a dielectric material and ground lines 123 on the back surface 121b and an end surface 121c. The signal line 122 extends from the side of an input part 122a of an excitation signal to a short-circuited end 122s coupled to the ground lines 123 formed on the end surface 121c. The signal line 122 becomes an excited magnetic part 122b where a magnetic field applied to the sample 46 I generated by a portion of the short-circuited end 122s. The sample is disposed on the excited magnetic part 122b. The excited magnetic part 122b extends in the length direction (X direction) at a predetermined width.

The signal line 122 is formed similar to the signal line 22 of the permeability measurement jig 10, and the detailed description thereof is omitted. The ground lines 123 are provided on the back surface 121b and the end surface 121c of the substrate 121 and are coupled to ground lines 42 of a coaxial cable 40 at the side of the input part 123a. The ground lines 123 are coupled to the signal line 122 through concatenation to a short-circuited end 122s of an excited magnetic part 22b at a portion formed on the end surface 121c. The ground lines 23 may be formed such that the width thereof (the length in Y direction) may be gradually narrowed toward the tip in the planar view and be formed on the whole back surface.

The output waveguide 130 is formed similar to the input waveguide 120. The signal line 132 becomes a detection part 132b that detects a magnetic flux generated by a portion of the short-circuited end 132 s coupled to the ground line 133 by applying a magnetic field to a sample. The detection part 132b is disposed to face the excited magnetic part 122b in parallel at a predetermined distance, and the sample 46 is disposed between the detection part 132b and the excited magnetic part 122b.

The signal line 132 is formed similar to the input waveguide 120, and the ground lines 133 are formed similar to the ground lines 123 of the input waveguide 120. The detailed description thereof is omitted.

In the permeability measurement jig 100, a non-magnetic insulation layer 48 may be provided between the excited magnetic part 122b and the detection part 132b to separate the excited magnetic part 122b from the detection part 132b by a predetermined distance. The non-magnetic insulation layer 48 may have an adhesive material on a surface to fix the sample 46 onto the excited magnetic part 22b, for example. A polyimide tape having a pressure sensitive adhesive may be used for the non-magnetic insulation layer.

The measurement principle for the permeability of the permeability measurement jig 100 is similar to that of the permeability measurement jig 10. The widths of the detection part 132b and the excited magnetic part 122b and the relationship between the widths and the distance between the detection part 132b and the excited magnetic part 122b are the same as those of the permeability measurement jig 10.

According to the present embodiment, the permeability measurement jig 100 has the same advantages as the permeability measurement jig 100 of the above embodiments of the permeability measurement jig 10. The input waveguide 120 and the output waveguide 130 have microstripline structures, and the excited magnetic part 122b and the detection part 132b serving as signal lines can be miniaturized. Also, the excited magnetic part 122b and the detection part 132b can be easily placed adjacent to fine magnetic powder substances, and accordingly the measurement sensitivity for the permeability can be improved. The excited magnetic part 122 and the detection part 132b are end portions short-circuited with the ground lines 123 and 133, respectively, and are placed to face each other. Accordingly, the effect of an electric field can be restrained. The detection signal of the detection part 132b is a signal caused by an induced electromotive force due to movement of magnetization of the sample 46, and a signal caused by the effect of an excitation signal from the excited magnetic part 122b is also added. Since the voltage of the signals caused by the detection signal and the excitation signal are proportional to frequencies, their ratios are the same. Accordingly, the permeability measurement jig 100 can obtain a constant measurement sensitivity across the whole measurement frequency. The permeability measurement jig 100 can greatly restrain reduction in the measurement sensitivity caused at the lower frequency side in the measurement device disclosed in Patent Document 1 and Non-Patent Document 1.

[Embodiment]

The permeability measurement device illustrated in FIG. 8 is used to measure the complex permeability of a single magnetic powder piece of permalloy as a sample in accordance with the permeability measurement method illustrated in FIG. 9. The magnetic powder is composed of $Ni_{80}Fe_{20}$ (atomic percentage), and is an amorphous prothallium having 100 to 300 μm in size and 1 to 2 μm in thickness of the single magnetic powder piece. The magnetic powder is attached to the excited magnetic part by means of a polyimide tape having the thickness of 35 μm and a pressure sensitive adhesive on one surface thereof, and is disposed to be in touch with the detection part on the other surface.

For the direct current magnetic field applied by an electromagnet, a predetermined magnetic field (n=1) is set to a zero magnetic field (zero T), and the saturated magnetic field is set to 1.5T. The measurement frequency is set to range from 10 MHz to 20 GHz, and the power and bandwidth of an excitation signal are set as illustrated in the table as follows. A vector network analyzer (model: N5222A) produced by Keysight Technologies in United States is used as the signal generation analysis part 60. A broadband low-noise amplifier (model: AH14149A) produced by Anritsu Corporation is used as the low-noise amplifier 55.

is not limited to the specific embodiments, and various variations and modifications can be made within the scope of the present invention recited in claims.

Note that additional remarks below are further disclosed in conjunction with the above description.

(Additional Remark 1)

A permeability measurement jig, comprising:
a first waveguide, wherein a signal line of the first waveguide comprises an excited magnetic part at one end side, and a magnetic field is generated at the excited magnetic part by an excitation signal; and
a second waveguide placed on the first waveguide, wherein a signal line of the second waveguide comprises a detection part at one end side, a detection signal is induced at the detection part due to an action of the magnetic field generated at the excited magnetic part to a measurement sample, and the detection part is placed above the excited magnetic part to face each other at a predetermined distance.

(Additional Remark 2)

The permeability measurement jig according to additional remark 1, wherein the signal lines of the first waveguide and the second waveguide extend in an opposite direction from the excited magnetic part and the detection part to the other end.

(Additional Remark 3)

The permeability measurement jig according to additional remark 1 or 2, further comprising:
a non-magnetic insulation layer between the excited magnetic part and the detection part.

(Additional Remark 4)

The permeability measurement jig according to any of additional remarks 1 to 3, wherein each of the first waveguide and the second waveguide comprises a signal line on a main surface of a first dielectric substrate and a second dielectric substrate and ground lines at both sides thereof, and the signal line is short-circuited to the respective ground lines at the respective one ends of the excited magnetic part and the detection part.

(Additional Remark 5)

The permeability measurement jig according to any of additional remarks 1 to 3, wherein each of the first waveguide and the second waveguide has a Coplanar line structure.

| Bandwidth | $FB_1$<br>10 MHz to 80 MHz | $FB_2$<br>80 MHz to 600 MHz | $FB_3$<br>600 MHz to 1.5 GHz | $FB_4$<br>1.5 GHz to 3.2 GHz | $FB_5$<br>3.2 GHz to 20 GHz |
|---|---|---|---|---|---|
| Excitation Signal Power | 6 dBm | −1 dBm | −8 dBm | −13 dBm | −20 dBm |

Figure 13:
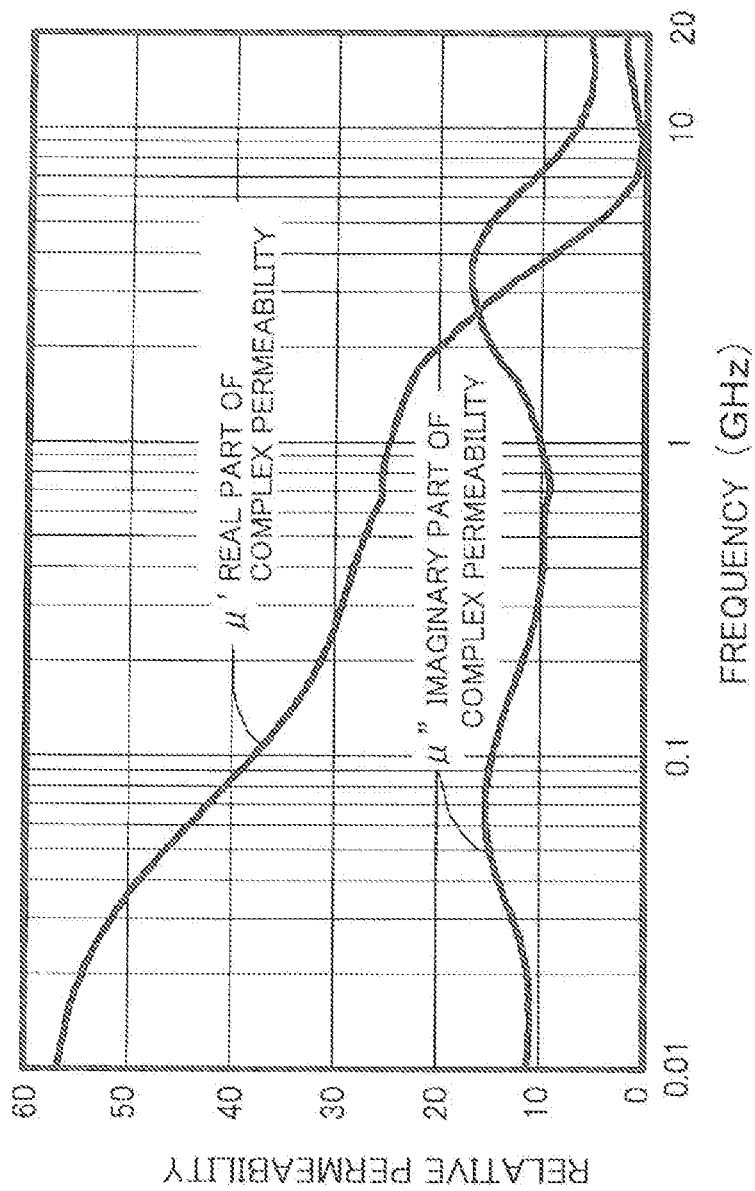
FIG. 13 is a diagram illustrating a frequency characteristic of a complex permeability according to an embodiment of the present invention.

FIG. 13 is a diagram for illustrating frequency characteristics of the complex permeability according to an embodiment of the present invention. In FIG. 11, moving averages are illustrated to remove artifacts caused by a cavity resonance of a shield casing of a permeability measurement jig at the frequency above 1 GHz from obtained complex permeability data. Referring to FIG. 13, it can be seen that even for a fine magnetic powder substance of about 100 to 300 μm in size and 1 to 2 μm in thickness, the real part and the imaginary part of the permeability can be measured across 10 MHz to 20 GHz. Note that the correction coefficient C is $8.5 \times 10^{-5}$.

Although some preferred embodiments of the present invention have been described above, the present invention (Additional Remark 6)

The permeability measurement jig according to additional remark 4 or 5, wherein the measurement sample is placed between the excited magnetic part and the detection part, under the excited magnetic part or on the detection part.

(Additional Remark 7)

The permeability measurement jig according to any of additional remarks 1 to 3, wherein each of the first waveguide and the second waveguide comprises a signal line on a front surface of a dielectric substrate and a ground line at a back side of the dielectric substrate, and the signal line is short-circuited to the respective ground lines at the respective one ends of the excited magnetic part and the detection part.

(Additional Remark 8)

The permeability measurement jig according to any of additional remarks 1 to 3, wherein each of the first waveguide and the second waveguide has a microstripline structure.

(Additional Remark 9)

The permeability measurement jig according to additional remark 7 or 8, wherein the measurement sample is placed between the excited magnetic part and the detection part.

(Additional Remark 10)

The permeability measurement jig according to any of additional remarks 1 to 9, wherein each of the excited magnetic part and the detection part is formed such that a facing length between the excited magnetic part and the detection part in a transmission direction of the excitation signal and the detection signal is smaller than or equal to 10 mm.

(Additional Remark 11)

The permeability measurement jig according to any of additional remarks 1 to 10, wherein each of the excited magnetic part and the detection part is formed such that a length of a direction perpendicular to a transmission direction of the excitation signal and the detection signal is smaller than or equal to 1 mm.

(Additional Remark 12)

The permeability measurement jig according to any of additional remarks 1 to 11, wherein each of the excited magnetic part and the detection part is formed such that a length of a direction perpendicular to a transmission direction of the excitation signal and the detection signal is greater than a distance between the excited magnetic part and the detection part.

(Additional Remark 13)

A permeability measurement device, comprising:

the permeability measurement jig according to any of additional remarks 1 to 12;

a signal generation part that is coupled to an input part of the permeability measurement jig and generates the excitation signal;

a signal analysis part that is coupled to an output part of the permeability measurement jig and analyzes the detection signal; and an arithmetic part that determines a permeability from the analyzed signal.

(Additional Remark 14)

The permeability measurement device according to additional remark 13, further comprising:

an excitation signal control part that controls the signal generation part to provide the excitation signal having a higher power level at a lower frequency side to the input part than at a higher frequency side.

(Additional Remark 15)

The permeability measurement device according to additional remark 13 or 14, further comprising:

an amplification part that amplifies the detection signal between the output part and the signal analysis part.

(Additional Remark 16)

The permeability measurement device according to any of additional remarks 13 to 15, further comprising:

a direct current magnetic field application part that applies a direct current magnetic field to the excited magnetic part and the detection part of the permeability measurement jig in a transmission direction of an excitation signal and a detection signal.

(Additional Remark 17)

A method of measuring a permeability by using the permeability measurement device according to any of additional remarks 13 to 16, comprising:

setting a power level of an excitation signal per measurement band and inputting the excitation signal to measure a detection signal, wherein the signal generation part is controlled to provide the excitation signal of a higher power level at a lower frequency side to the input part of the permeability measurement jig than at a higher frequency side.

REFERENCE SIGNS LIST 10, 11 Permeability measurement jig
20, 120 Input waveguide
21, 31, 121, 131 Substrate
22, 32, 122, 132 Signal line
22b, 122b Excited magnetic part
22s, 32s, 122s, 132s Short-circuited end
23, 33, 123, 133 Ground line
30, 130 Output waveguide
32b, 132b Detection part
50 Permeability measurement device
60 Signal generation part
70 Direct current magnetic field generation part
80 Control arithmetic part

The invention claimed is:

1. A permeability measurement jig, comprising:
a first waveguide, wherein a signal line of the first waveguide comprises an excited magnetic part at one end side, and a magnetic field is generated at the excited magnetic part by an excitation signal; and
a second waveguide, wherein a signal line of the second waveguide comprises a detection part at one end side, a detection signal is induced at the detection part due to an action of the magnetic field generated at the excited magnetic part to a measurement sample, and the detection part is placed above the excited magnetic part to face each other at a predetermined distance.

2. The permeability measurement jig according to claim 1, wherein the signal lines of the first waveguide and the second waveguide extend in an opposite direction from the excited magnetic part and the detection part to the other end.

3. The permeability measurement jig according to claim 1, further comprising:
a non-magnetic insulation layer between the excited magnetic part and the detection part.

4. The permeability measurement jig according to claim 1, wherein each of the first waveguide and the second waveguide comprises a signal line on a main surface of a first dielectric substrate and a second dielectric substrate and ground lines at both sides thereof, and the signal line is short-circuited to the respective ground lines at the respective one ends of the excited magnetic part and the detection part.

5. The permeability measurement jig according to claim 1, wherein each of the first waveguide and the second waveguide has a Coplanar line structure.

6. The permeability measurement jig according to claim 1, wherein each of the first waveguide and the second waveguide comprises a signal line on a front surface of a dielectric substrate and a ground line at a back side of the dielectric substrate, and the signal line is short-circuited to the respective ground lines at the respective one ends of the excited magnetic part and the detection part.

7. The permeability measurement jig according to claim 1, wherein each of the first waveguide and the second waveguide has a microstripline structure.

8. The permeability measurement jig according to claim 1, wherein each of the excited magnetic part and the detection part is formed such that a facing length between the excited magnetic part and the detection part in a transmission direction of the excitation signal and the detection signal is smaller than or equal to 10 mm.

9. The permeability measurement jig according to claim 1, wherein each of the excited magnetic part and the detection part is formed such that a length of a direction perpendicular to a transmission direction of the excitation signal and the detection signal is smaller than or equal to 1 mm.

10. The permeability measurement jig according to claim 1, wherein each of the excited magnetic part and the detection part is formed such that a length of a direction perpendicular to a transmission direction of the excitation signal and the detection signal is greater than a distance between the excited magnetic part and the detection part.

11. A permeability measurement device, comprising:
a permeability measurement jig,
wherein the permeability measurement jig includes:
   a first waveguide, wherein a signal line of the first waveguide comprises an excited magnetic part at one end side, and a magnetic field is generated at the excited magnetic part by an excitation signal; and
   a second waveguide, wherein a signal line of the second waveguide comprises a detection part at one end side, a detection signal is induced at the detection part due to an action of the magnetic field generated at the excited magnetic part to a measurement sample, and the detection part is placed above the excited magnetic part to face each other at a predetermined distance;
a signal generation part that is coupled to an input part of the permeability measurement jig and generates the excitation signal;
a signal analysis part that is coupled to an output part of the permeability measurement jig and analyzes the detection signal; and
an arithmetic part that determines a permeability from the analyzed signal.

12. The permeability measurement device according to claim 11, further comprising:
an excitation signal control part that controls the signal generation part to provide the excitation signal having a higher power level at a lower frequency side to the input part than at a higher frequency side.

13. The permeability measurement device according to claim 11, further comprising:
an amplification part that amplifies the detection signal between the output part and the signal analysis part.

14. The permeability measurement device according to claim 11, further comprising:
a direct magnetic field application part that applies a direct current magnetic field to the excited magnetic part and the detection part of the permeability measurement jig in a transmission direction of an excitation signal and a detection signal.

15. A method of measuring a permeability by using tho a permeability measurement device, wherein the permeability measurement jig includes:
   a first waveguide, wherein a signal line of the first waveguide comprises an excited magnetic part at one end side, and a magnetic field is generated at the excited magnetic part by an excitation signal; and
   a second waveguide, wherein a signal line of the second waveguide comprises a detection part at one end side, a detection signal is induced at the detection part due to an action of the magnetic field generated at the excited magnetic part to a measurement sample, and the detection part is placed above the excited magnetic part to face each other at a predetermined distance, the method comprising:
setting a power level of an excitation signal per measurement band and inputting the excitation signal to measure a detection signal, wherein the signal generation part is controlled to provide the excitation signal of a higher power level at a lower frequency side to the input part of the permeability measurement jig than at a higher frequency side.

* * * * *